United States Patent
Bae et al.

(10) Patent No.: US 6,518,645 B2
(45) Date of Patent: Feb. 11, 2003

(54) SOI-TYPE SEMICONDUCTOR DEVICE AND METHOD OF FORMING THE SAME

(75) Inventors: Geum-Jong Bae, Suwon (KR); Sang-Su Kim, Kyunggi-do (KR); Tae-Hee Choe, Seoul (KR); Hwa-Sung Rhee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/095,169

(22) Filed: Mar. 11, 2002

(65) Prior Publication Data

US 2002/0139977 A1 Oct. 3, 2002

(30) Foreign Application Priority Data

Mar. 30, 2001 (KR) .................................. 2001-0016834

(51) Int. Cl.[7] ....................... H01L 31/117; H01L 27/01; H01L 27/12; H01L 31/0392
(52) U.S. Cl. .................. 257/616; 438/154; 438/164; 257/347
(58) Field of Search ................ 257/347, 349, 257/351, 353, 354, 616; 438/154, 164

(56) References Cited

U.S. PATENT DOCUMENTS 6,432,754 B1 * 8/2002 Assaderaghi et al. ....... 438/149
6,445,016 B1 * 9/2002 An et al. ..................... 257/192

* cited by examiner

Primary Examiner—Ngâan V. Ngô
(74) Attorney, Agent, or Firm—Mills & Onello, LLP

(57) ABSTRACT

In an SOI-type semiconductor device and a method of forming the same a semiconductor device is formed in an SOI-type substrate that is composed of a lower silicon layer, a buried oxide layer, and an SOI layer. The SOI substrate includes a device region isolated by a device isolation layer and the buried oxide layer, in which a source/drain region for forming at least one MOSFET at a body composed of the SOI layer is formed; and a ground region which is isolated from the device region by the device isolation layer and is composed of the body. A bottom portion of the device isolation layer is separated from the buried oxide layer by a connecting portion that electrically connects a body of the device region to a body of the ground region through the SOI layer. A silicon germanium layer is formed in the SOI layer, and at least partially remains at the SOI layer connecting the body of the device region to the body of the ground region in the connecting portion. Preferably, the device isolation layer is a trench-type isolation layer. The silicon germanium layer is formed at an interface between the SOI layer and the lowest portion of the SOI layer, i.e., a buried oxide layer, or is sandwiched between silicon layers that constitute the SOI layer under the SOI layer.

16 Claims, 7 Drawing Sheets

SOI-TYPE SEMICONDUCTOR DEVICE AND METHOD OF FORMING THE SAME

RELATED APPLICATION

This application relies for priority upon Korean Patent Application No. 2001-16834, filed on Mar. 30, 2001, the contents of which are herein incorporated by reference in their entirety.

FIELD OF THE INVENTION

The present invention generally relates to a semiconductor device using an SOI-type semiconductor substrate and a method of forming the semiconductor device. More specifically, the present invention is directed to a semiconductor substrate for suppressing a floating body effect (FBE) phenomenon that occurs as devices formed in an SOI-type substrate are fully isolated from one another and a method of forming the semiconductor device.

BACKGROUND OF THE INVENTION

In semiconductor device fabrication, a number of devices are formed on a silicon wafer surface and are electrically connected through interconnections. Isolation devices are formed in a narrow region so as not to interfere with peripheral devices. To avoid such interference, impurity junctions and device isolation layers are employed. As semiconductor devices undergo further integration, the distance between devices to be isolated becomes smaller. Conventional device isolation layers therefore no longer meet the requirements for sufficient isolation.

A junction-type device isolation approach is not suitable for a semiconductor device employing a high voltage device in that a resisting pressure at the junction surface is limited. Also, the junction-type device isolation method is not suitable in a high radioactive environment because current is created at the junction depletion surface by radioactive rays such as gamma rays.

For overcoming such disadvantages, a semiconductor device using an SOI-type substrate was suggested, in which a buried oxide layer is formed under a silicon layer in which devices are formed. Particularly, a high performance semiconductor device such as a central processing unit (CPU) commonly employs an SOI-type semiconductor device in which a device region is completely isolated by an insulating layer.

Referring now to FIG. 1, a device isolation layer 112 or the like is formed on an SOI-type substrate in which a lower silicon layer 100, a buried oxide layer 110, and an SOI layer are stacked. Following the device isolation step, the SOI layer constitutes a semiconductor device body 122 at each isolated region that is divided by the buried oxide layer 110 and the device isolation layer 112. Namely, the body 122 is completely electrically floated by lower and lateral insulating layers, which is an original purpose of the SOI substrate. Unfortunately, a floating body may cause various side effects. For example, when a voltage is applied to a gate electrode in an NMOSFET transistor to make current flow from a drain region 116 to a source region 114 through a channel region 120, atoms constituting the body collide with electrons to generate pairs of hole-electrons, which accumulate in the floating body. Holes generated in a semiconductor device using a conventional bulk substrate can be removed through a ground line coupled to the substrate. However, in the floating device, holes continuously accumulate around the center of the low potential region (i.e., the lower portion of the interface between the source region 114 and the channel region 120) that form the isolated semiconductor layer in each area of the SOI-type semiconductor device. The accumulated holes serve to heighten the channel potential and lower the threshold voltage, thereby altering the drain voltage-current characteristic such as a kink effect.

Assuming that the holes are intensively accumulated, the body layer including the channel between source and drain regions forms a P-type impurity region. Therefore, the P-type impurity region constitutes a form of NPN-type bipolar transistor together with the N-type impurity regions forming a source and drain (parasitic bipolar action). Arising from this phenomenon, the breakdown voltage of the transistor device is lowered, which adversely impacts normal device operation. Furthermore, assuming the accumulated holes are coupled to electrons that constitute a portion of the current for operating a transistor when a specific operation current flows, the coupling causes a form of a leakage current that can result in operating errors.

For that reason, special ground means for removing holes accumulated at each region of a semiconductor device using a SOI-type substrate are utilized. One example of such ground means is to form a contact coupled to a partial body region (the region where source-channel interface holes are accumulated), the contact in turn being connected to a ground line. In view of this, a contact region 130 must be added to existing active regions such as source/drain regions 114 and 116 and a channel region, as shown in FIG. 3. In this case, the contact forming region is extendedly formed at a hole accumulating portion of the device. The source/drain regions 114 and 116 are surrounded by a device isolation layer 112, and are divided by a gate electrode 118. The existing shape of the device region is therefore changed for forming the contact and the corresponding ground line. Unfortunately, arising from this change in shape, device integration density is reduced and parasitic capacitance is increased. In addition, processing costs are increased.

With reference to FIGS. 4 and 5, another means for forming the ground contact involves formation of a ground region 230 around an existing device region 222 independent therefrom. A shallow trench isolation layer 212 is formed so that a bottom side of a device isolation layer 220 does not contact a buried oxide layer at the connecting portion 220 that is a part of a device isolation layer forming an interval between the device region 222 and a ground region 230. Thus, a body of the device region 222 is linked with a body of the ground region 230 through an SOI layer that is positioned at a gap between a shallow trench isolation layer 212 and a lower buried oxide layer 110. Accumulated holes, which are generated from the device region 222, are drained to the exterior through the ground region 230, a contact plug 232, and a ground interconnection 234. When such a body linked structure is applied to a semiconductor device, a large body width of a device region and a large channel width of a MOS transistor make it difficult to readily drain holes that are accumulated at a distant position from the connecting part.

In order to readily drain holes under a shallow trench isolation layer, it is preferable that a concentration of P-type impurities is high at a connecting semiconductor layer to operate as a hole passage between a bottom side of a partial trench isolation layer of a connecting part and a buried oxide layer. When boron ions are introduced into the connecting part as P-type impurities, they are easily diffused to peripheral buried oxide layer or trench isolation layer. This lowers the concentration of the boron impurities, which, in turn, operates as an impediment to removal of the holes.

SUMMARY OF THE INVENTION

The present invention addresses the above-identified problems resulting from the floating body phenomenon of the SOI-type semiconductor device.

It is an object of the present invention to provide an SOI-type semiconductor device capable of achieving high speed operation and precise device isolation, while preventing device operation error which results from a floating body phenomenon.

It is another object of the present invention to provide an SOI-type semiconductor device capable of effectively draining holes accumulated at the body of an isolated NMOS transistor device region.

It is still another object of the present invention to provide a method of forming the foregoing SOI-type semiconductor devices.

In a first aspect, the present invention is directed to a silicon-on-insulator(SOI)-type semiconductor device including a lower silicon layer, a buried oxide layer, and an SOI layer. The device comprises a device region isolated by a device isolation body and the buried oxide layer, in which a source/drain region is provided for forming at least one device in the SOI layer. A ground region is isolated from the device region by the device isolation body. A silicon germanium layer is formed in the SOI layer, a connection portion of the silicon germanium layer extending beneath the device isolation body to connect the device region to the ground region.

In one embodiment, the device isolation body extends partially into the upper surface of the silicon germanium layer. The silicon germanium layer may be formed at an interface between the SOI layer and the buried oxide layer. The silicon germanium layer may optionally be formed between silicon layers constituting the SOI layer. The content of germanium in the silicon germanium layer is preferably 10 to 40 percent by weight, and preferably comprises a single crystalline layer of a thickness of 100 to 800 angstroms, in which case the silicon crystalline layer thereon has a thickness of 500 to 2000 angstroms.

Channel ion implantation using boron ions is optionally carried out for an NMOS transistor formed in the device region, and a high concentration P-type ion implantation is carried out in the ground region.

The device isolation body can be formed using trench-type device isolation.

In one embodiment, the device region is an NMOS transistor region; wherein a PMOS transistor region is further included in the SOI layer; wherein the connecting portion is formed only under the device isolation body between the NMOS transistor region and the ground region; and wherein a transistor device formed by the NMOS transistor region and the PMOS transistor region constitutes a CMOS semiconductor device.

In another aspect, the present invention is directed to a method of forming an SOI-type semiconductor device. The method comprises the steps of: preparing an SOI-type substrate including a lower silicon layer, a buried oxide layer, and an SOI layer wherein a silicon germanium layer is formed in a lower portion of the SOI layer; and forming a trench isolation layer on the SOI-type substrate, wherein a bottom portion of the trench device isolation layer is located on the silicon germanium layer at a predetermined location between a device region and a ground region.

The device isolation layer preferably extends partially into the upper surface of the silicon germanium layer.

The step of forming the trench isolation layer comprises the steps of: forming a shallow trench partially into the silicon germanium layer so as to separate a bottom portion of the trench from the buried oxide layer by the remaining silicon germanium layer in the predetermined location; forming a deep trench so as to expose the buried oxide layer in the device isolation region other than in the predetermined portion; and stacking an oxide layer using a chemical vapor deposition (CVD) technique to fill the deep and shallow trenches.

After the step of forming the trench isolation layer, the method further comprises the steps of forming an ion implanting mask, and performing an ion implantation for forming an electrode to the SOI layer of the ground region; performing a channel ion implantation to the device region; forming a gate electrode pattern including a gate electrode of the device region; and performing ion implantation for forming a source/drain region in the device region, using the gate electrode pattern as an ion implanting mask.

The channel ion implantation and the ion implantation for forming the source/drain region may be performed once for PMOS and NMOS transistor regions; a gate electrode is patterned to both the PMOS transistor region and the NMOS transistor region.

The step of performing ion implantation for forming the electrode is performed at the same time as the time when ions are implanted into the PMOS transistor region in the steps of performing the ion implantation for forming the source/drain region.

In a method of implanting ions into the silicon germanium layer, if the silicon germanium layer is an epitaxial layer, boron ions are provided to a source gas during an epitaxy growth. Alternatively, after preparation of an SOI-type substrate with a silicon germanium layer, boron ions are implanted into the silicon germanium layer. A curing process is then performed.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 8:
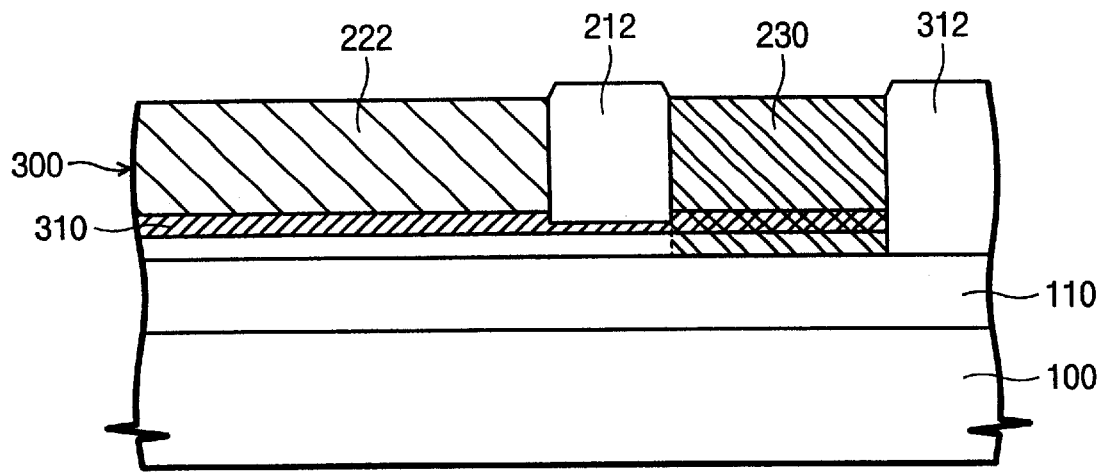
Figure 9:
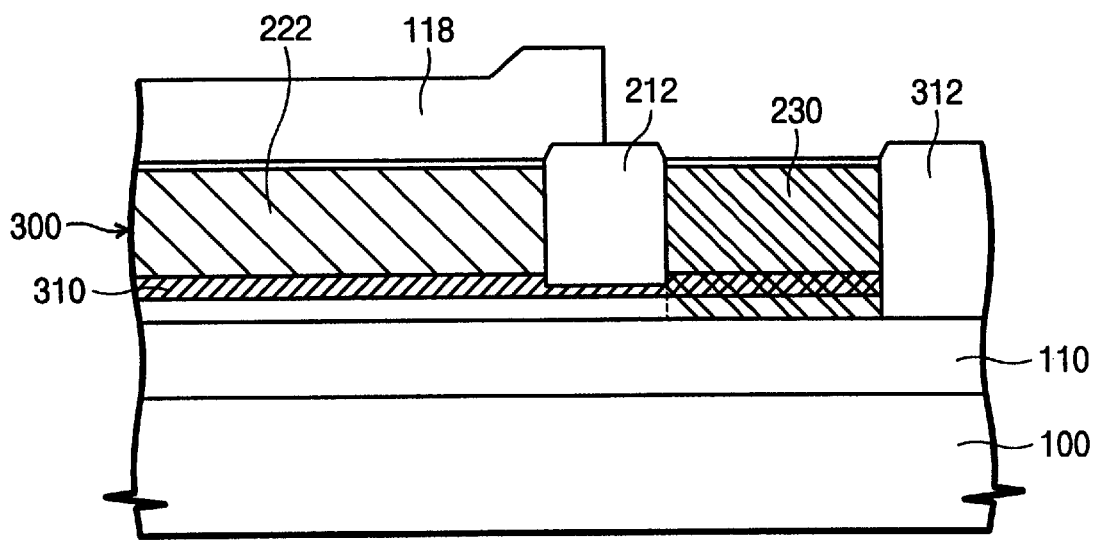
Figure 10:
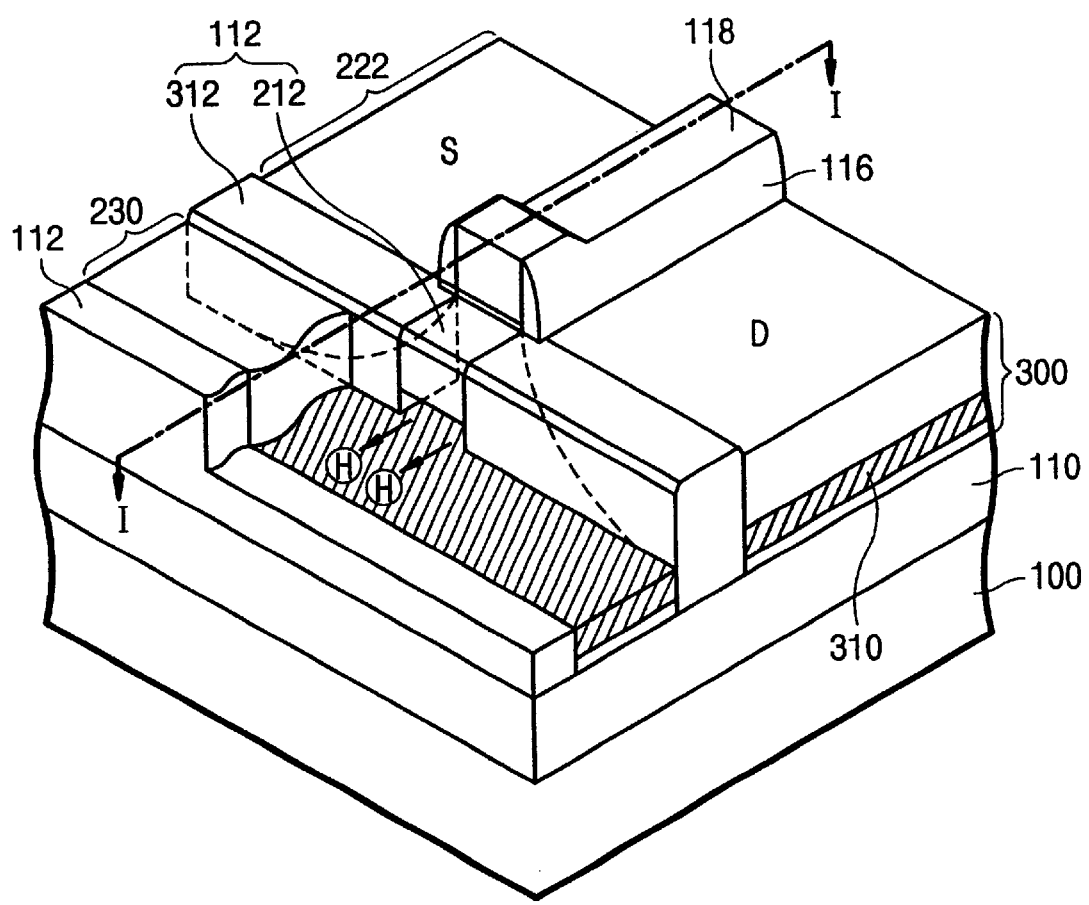
FIG. 10 is a partially sectional perspective view schematically showing a construction of a ground region, a device region, and a device isolation region there between for a semiconductor device formed according to the foregoing steps.

FIG. 6 through FIG. 9 illustrate the formation steps of one embodiment of the present invention, taken along section line I—I of the perspective view of FIG. 10.

Figure 1:
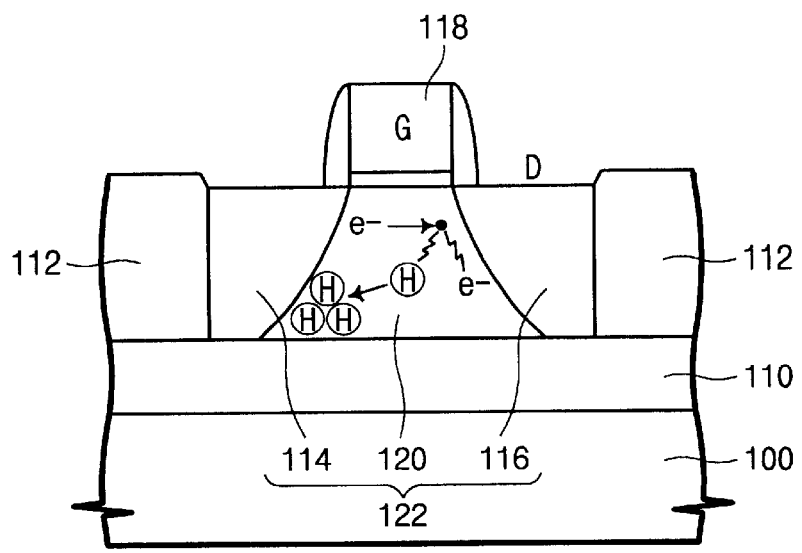
FIG. 1 is a concept diagram showing a conventional floating body phenomenon.
Figure 2:
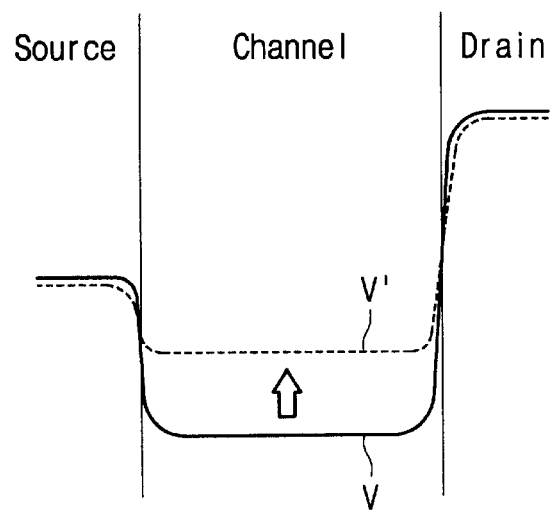
FIG. 2 a concept diagram showing a channel potential change based upon the conventional floating body phenomenon.
Figure 3:
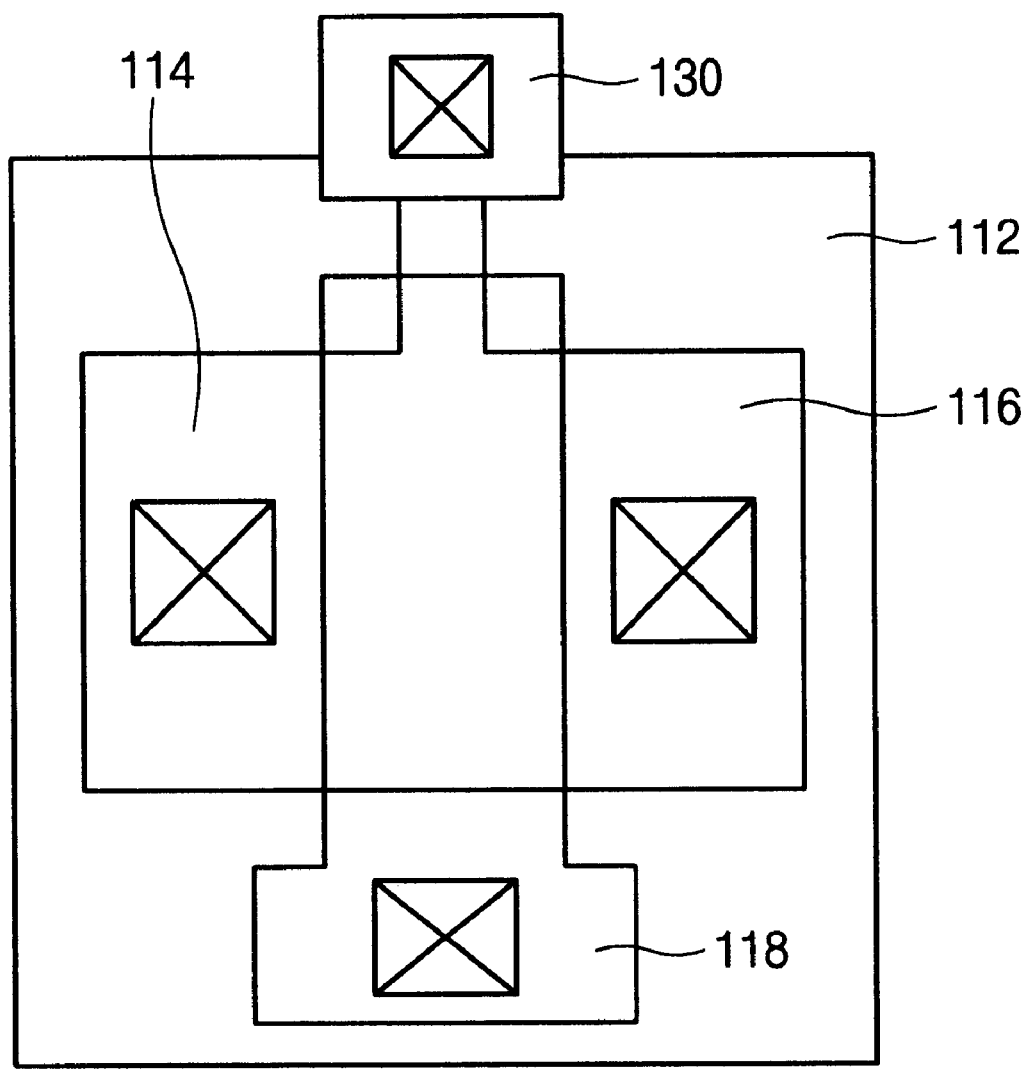
FIG. 3 is a concept diagram showing one example of a conventional structure for preventing the floating body phenomenon.
Figure 4:
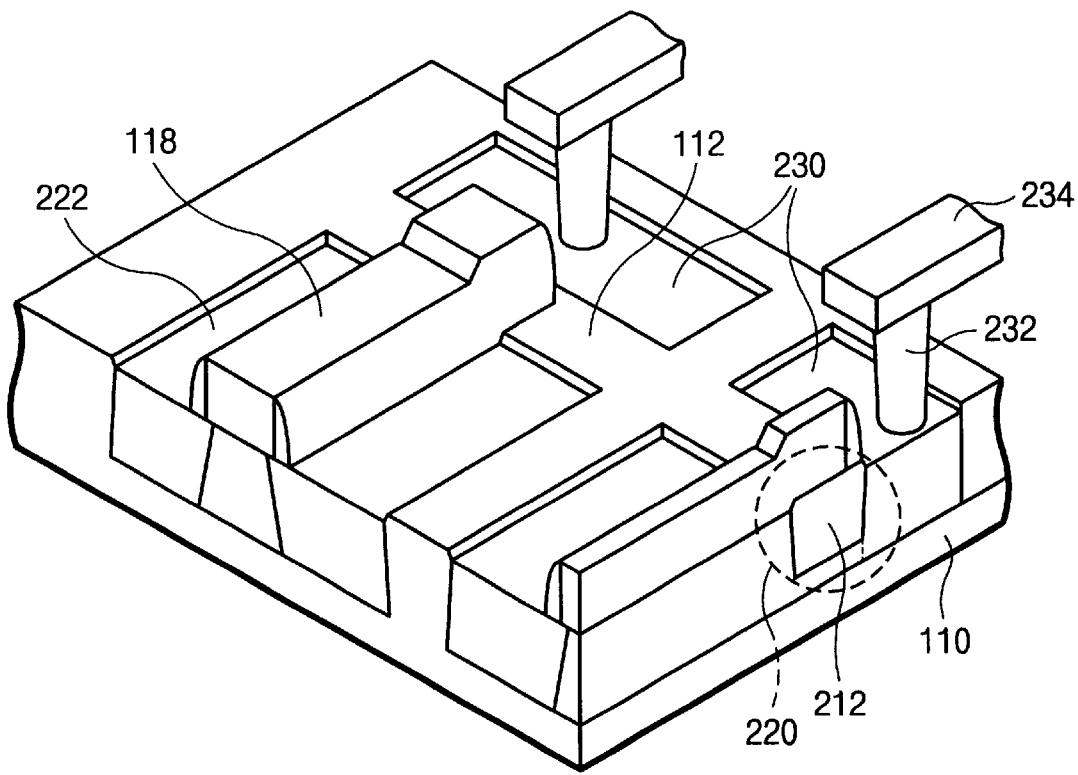
FIG. 4 and FIG. 5 are a partially sectional perspective view and cross-sectional views respectively showing another example of a semiconductor device.
Figure 5:
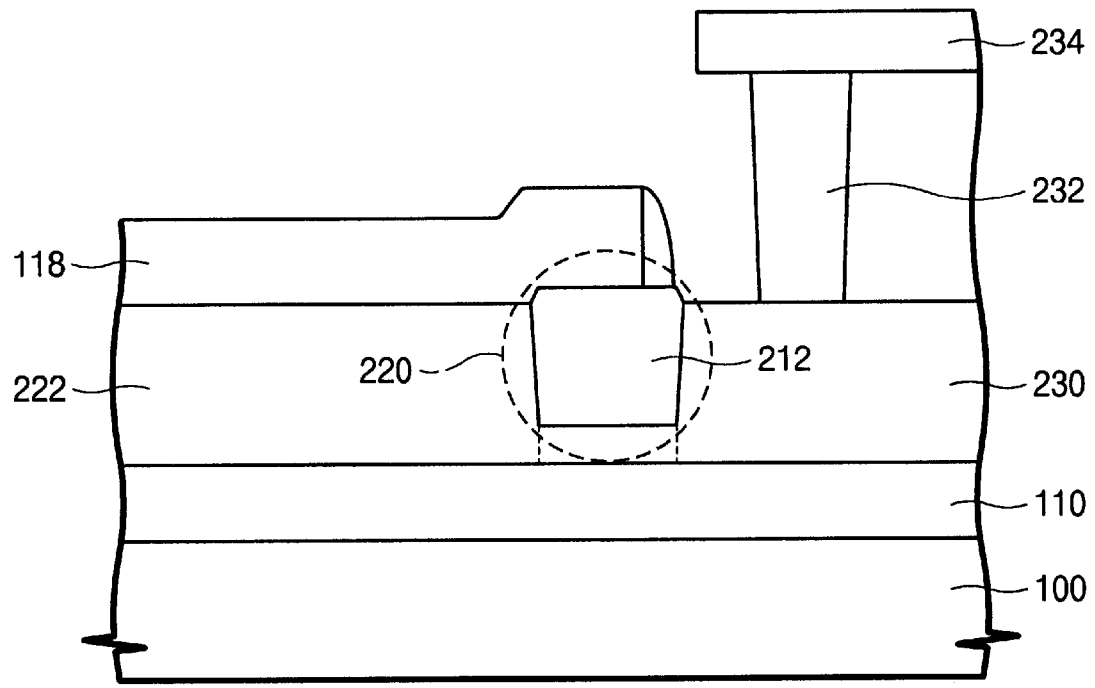
Figure 6:
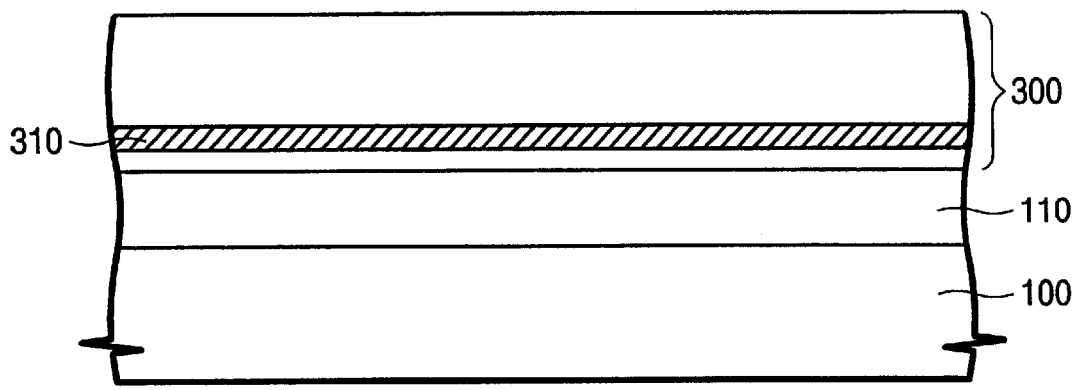
FIG. 6 through FIG. 9 are process diagrams illustrating processing steps of one embodiment of the present invention.

Referring to FIG. 6, an SOI-type substrate includes a lower silicon layer 100, a buried oxide layer 110, and an SOI layer where a silicon germanium single crystalline layer 310 is formed. There are various approaches to prepare go the SOI-type substrate. In one example approach, a silicon germanium single crystalline layer or a silicon germanium single crystalline layer and a silicon layer are grown in a bulk silicon substrate, and an oxide layer is formed on a surface of another bulk silicon substrate. The two bulk silicon substrates are adhered to each other by heat. The base silicon layer of the silicon germanium single crystalline layer substrate is then nearly entirely removed.

In an SOI-type substrate, a silicon germanium single crystalline layer formed in an SOI layer may be positioned at the lowest surface of the SOI layer in order to contact the buried oxide layer. A silicon single crystalline layer may be formed between the buried oxide layer and the silicon germanium single crystalline layer to a thickness of, for example, 500 Å or less. Conventionally, the entire SOI layer is formed to a thickness of 1500 Å to 2000 Å. Preferably, the silicon germanium single crystalline layer has a thickness of 100 Å to 800 Å, and the silicon single crystalline layer thereon has a thickness of 500 Å to 1500 Å. The germanium content of the silicon germanium single crystalline layer may have a distribution of low-high-low concentration, a distribution of high-low concentration or an identical distribution from a lower part to an upper part of the silicon germanium single crystalline layer. The low concentration is typically 0 to 10 percent by weight, the high concentration is typically 10 to 40 percent by weight, and the identical concentration distribution typically has a concentration of 20 to 30 percent by weight.

Figure 7:
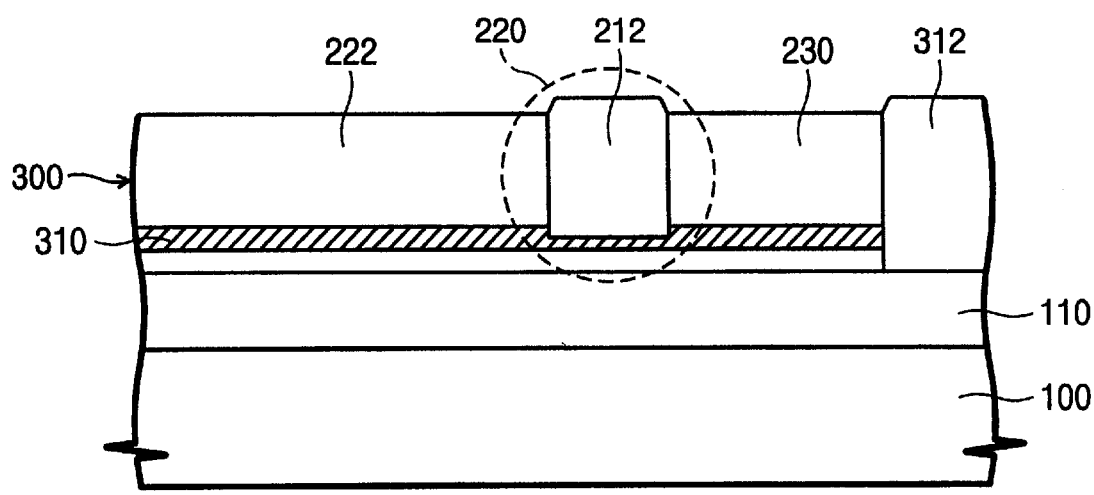

Referring now to FIG. 7, a trench isolation layer 212 for device isolation is formed on the SOI-type substrate. A bottom side of a part of the trench isolation layer 212 is situated in a silicon germanium single crystalline layer 310. Therefore, at a connecting part 220, the trench isolation layer between a device region 222 and a ground region 230 is formed as a shallow trench isolation layer 212 whose lower portion does not pass entirely thought the a silicon germanium single crystalline layer 310. In this portion, an electric passage for draining holes is created between the device region 222 and the ground region 230 through the remaining portion of the silicon germanium single crystalline layer 310 in an SOI layer 300. At other parts except the connecting part 220, the trench isolation layer is formed as a deep trench isolation layer 312 that contacts the underlying buried oxide layer 110 to be coupled to a silicon oxide layer.

In a CMOS-type semiconductor device comprising a PMOS transistor region and an NMOS transistor region, problems resulting from the floating body effect are not as severe at the PMOS transistor region as they are at the NMOS transistor region. Therefore, in one embodiment, the passage can be created, for example, only between the NMOS transistor region and an adjacent ground region.

In a method of forming a trench isolation layer the depth of which at a connecting part is different than the depth of other parts, a patterning process is carried out to form a shallow trench which does not extent to the buried oxide layer. A deep trench is then formed so that the buried oxide layer is exposed through a patterning process. The order of formation of the two trenches may optionally be reversed. Conventionally, a silicon nitride layer is initially formed on a substrate so as to prevent contamination of the substrate surface layer in a patterning process for forming the trench. A photoresist is coated thereon, and then a pattern exposure process is carried out. If an etch mask pattern is formed using a silicon nitride layer, an SOI layer is etched using the pattern as an etch mask.

After formation of a trench, thermal oxidation of the trench inner wall, formation of a silicon nitride liner, and stacking a silicon oxide layer using a chemical vapor deposition (CVD) technique are conventionally carried out. A CVD oxide layer filling a trench is planarized by a chemical mechanical polishing (CMP) technique or the like, exposing a silicon nitride layer etch mask pattern. Then, the silicon nitride layer etch mask pattern is wet-etched for removal.

Referring now to FIG. 8, P-type ions such as boron are selectively implanted into the ground region 230 to enhance conductivity. The ion implantation is carried out following formation of a photoresist ion implanting mask (not shown) for selective ion implantation. A channel ion implantation is carried out in a device region 222 using a special photoresist pattern (not shown). With reference to FIG. 9, a gate layer is formed and patterned to form a gate electrode 118. Conventional subsequent processes such as N-type ion implantation for forming an NMOS transistor are then carried out. The gate layer may be formed of a single conductive layer or a multiple layer of polysilicon and metal silicide.

Generally, gate electrodes in a CMOS-type semiconductor device are simultaneously patterned for both NMOS and PMOS transistor regions. An ion implantation for forming source/drain regions is carried out at each of the NMOS and PMOS transistor regions. Implantation of ions into a ground region may be made at the same time as a deep ion implantation for forming source/drain regions in the PMOS transistor region, after formation of the gate electrode. A typical dose level of the deep ion implantation is 1E14 to 1E16 ion/cm$^2$.

In more general format, when a spacer is formed on both sidewalls of a gate electrode, ions are implanted into each region so as to form an LDD region after formation of the gate electrode. The concentration of the ion implantation is as low as 1E12 ion/cm$^2$. A space oxide layer is conformally stacked on an entire surface of the gate electrode, and is anisotropically etched to form a space on both sides of the gate electrode. Ions of a high concentration are implanted into each region so as to form source/drain regions.

With respect to the ground region 230, one ground region may be connected to each of many transistor regions through a passage on the silicon germanium layer 310 and be formed as an interconnection in a substrate. In this case, a contact for external connection may be formed at a peripheral end of the interconnection for the ground region. In another embodiment, the ground region may be formed at each transistor region. In this case, a contact for connection to an external ground interconnection may be formed at each ground region.

Construction and operation of the foregoing SOI-type semiconductor device will now be described hereinbelow. A silicon germanium layer is formed below an SOI layer. Therefore, when boron ions are implanted in accordance with channel doping of an NMOS transistor, they are intensively distributed to a silicon germanium layer with high retention. The boron ions are not diffused into the underlying peripheral oxide layer (i.e., buried oxide layer) and a device isolation layer. As impurities are diffused to the peripheral oxide layer, impurity concentration is reduced in order to prevent a drop in electrical resistance of the device region.

As current flows to a channel of the NMOS transistor in accordance with device operation, electrons and body atoms collide with one another to generate pairs of hole-electrons. The electrons constitute a channel current, and are moved to a drain region. As described above in association with the prior art, the holes H are induced to a low potential region under the interface between the source region and the channel. With reference to FIG. 10, the holes H are thus transferred into the silicon germanium single crystalline layer that is formed through the low potential region. Mobility of the holes is high due to boron ions that highly distributed to the silicon germanium single crystalline layer. Therefore, the electrical resistance of the silicon germanium single crystalline layer is reduced, as compared to the hole removal path of the prior art. The silicon germanium single crystalline layer, which partially remains intact under a shallow trench isolation feature for connecting a device region to a ground region, provides a suitable passage for the removal of holes created in the device region. When a small amount of negative voltage is applied to the corresponding ground terminal, the holes can be drained more readily.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A silicon-on-insulator(SOI)-type semiconductor device including a lower silicon layer, a buried oxide layer, and an SOI layer comprising:
    a device region isolated by a device isolation body and the buried oxide layer, in which a source/drain region is provided for forming at least one device in the SOI layer; and
    a ground region isolated from the device region by the device isolation body; and
    a silicon germanium layer formed in the SOI layer, a connection portion of the silicon germanium layer extending beneath the device isolation body to connect the device region to the ground region.

2. The device of claim 1 wherein the device isolation body extends partially into the upper surface of the silicon germanium layer.

3. The device of claim 1, wherein the silicon germanium layer is formed at an interface between the SOI layer and the buried oxide layer.

4. The device of claim 1, wherein the silicon germanium layer is formed between silicon layers constituting the SOI layer.

5. The device of claim 1, wherein a content of germanium in the silicon germanium layer is 10 to 40 percent by weight.

6. The device of claim 1, wherein the silicon germanium layer comprises a single crystalline layer.

7. The device of claim 6, wherein the silicon germanium single crystalline layer has a thickness of 100 to 800 angstroms, and wherein the silicon crystalline layer thereon has a thickness of 500 to 2000 angstroms.

8. The device of claim 1, wherein a channel ion implantation using boron ions is carried out for an NMOS transistor formed in the device region, and wherein a high concentration P-type ion implantation is carried out in the ground region.

9. The device of claim 1, wherein the device isolation body is formed using trench-type device isolation.

10. The device of claim 1, wherein the device region is an NMOS transistor region;
    wherein a PMOS transistor region is further included in the SOI layer;
    wherein the connecting portion is formed only under the device isolation body between the NMOS transistor region and the ground region; and
    wherein a transistor device formed by the NMOS transistor region and the PMOS transistor region constitutes a CMOS semiconductor device.

11. A method of forming an SOI-type semiconductor device, comprising the steps of:
    preparing an SOI-type substrate including a lower silicon layer, a buried oxide layer, and an SOI layer wherein a silicon germanium layer is formed in a lower portion of the SOI layer; and
    forming a trench isolation layer on the SOI-type substrate, wherein a bottom portion of the trench device isolation layer is located on the silicon germanium layer at a predetermined location between a device region and a ground region.

12. The method of claim 11 wherein the device isolation layer extends partially into the upper surface of the silicon germanium layer.

13. The method of claim 11, wherein the step of forming the trench isolation layer comprises the steps of:
    forming a shallow trench partially into the silicon germanium layer so as to separate a bottom portion of the trench from the buried oxide layer by the remaining silicon germanium layer in the predetermined location;
    forming a deep trench so as to expose the buried oxide layer in the device isolation region other than in the predetermined portion; and
    stacking an oxide layer using a chemical vapor deposition (CVD) technique to fill the deep and shallow trenches.

14. The method of claim 11, after the step of forming the trench isolation layer, further comprising the steps of:
    forming an ion implanting mask, and performing an ion implantation for forming an electrode to the SOI layer of the ground region;
    performing a channel ion implantation to the device region;
    forming a gate electrode pattern including a gate electrode of the device region; and
    performing ion implantation for forming a source/drain region in the device region, using the gate electrode pattern as an ion implanting mask.

15. The method of claim 14, wherein the channel ion implantation and the ion implantation for forming the source/drain region are performed once for PMOS and NMOS transistor regions; and
    wherein a gate electrode is patterned to both the PMOS transistor region and the NMOS transistor region.

16. The method of claim 15, wherein the step of performing ion implantation for forming the electrode in the SOI layer of the ground region are performed at the same time as when ions are implanted into the PMOS transistor region in the steps of performing the ion implantation for forming the source/drain region.

* * * * *